(12) United States Patent
Emek et al.

(10) Patent No.: US 7,788,610 B2
(45) Date of Patent: Aug. 31, 2010

(54) RANDOM STIMULI GENERATION OF MEMORY MAPS AND MEMORY ALLOCATIONS

(75) Inventors: Roy Emek, Tel Aviv (IL); Itai Jaeger, Lavon (IL); Yoav Avraham Katz, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 768 days.

(21) Appl. No.: 11/625,831

(22) Filed: Jan. 23, 2007

(65) Prior Publication Data

US 2008/0177968 A1    Jul. 24, 2008

(51) Int. Cl.
*G06F 17/50* (2006.01)

(52) U.S. Cl. .................. 716/4; 716/1; 716/5; 716/17

(58) Field of Classification Search .............. 716/1, 716/4, 5, 17
See application file for complete search history.

(56) References Cited

U.S. PATENT DOCUMENTS

| | | | |
|---|---|---|---|
| 6,026,230 A | 2/2000 | Lin et al. | |
| 6,845,440 B2 | 1/2005 | Thompson et al. | |
| 6,959,428 B2 | 10/2005 | Broberg, III et al. | |
| 7,523,450 B2 * | 4/2009 | Cardinell | 717/162 |
| 2004/0088600 A1 | 5/2004 | Adir et al. | |

OTHER PUBLICATIONS

Chandra et al., in "AVPGEN—A Test Generator for Architecture Verification," IEEE Transactions on Very Large Scale Integration (VLSI) Systems, (3:2), Jun. 1995, pp. 188-200.
Kumar in "Algorithms for Constraint Satisfaction Problems: A Survey," Artificial Intelligence Magazine, 13:1 (1992), pp. 32-44.
Bin et al., "Using Constraint Satisfaction Formulation and Solution Techniques for Random Test Program Generation," IBM Systems Journal, (41:3), 2002, pp. 386-402.
Adir et al., "Piparazzi: A Test Program Generator for Micro-architecture Flow Verification," Eighth IEEE International High-Level Design Validation and Test Workshop (Nov. 12-14, 2003), pp. 23-28.
Adir et al., "Improving Test Quality Through Resource Reallocation", Proceedings Sixth IEEE International High-Level Design Validation and Test Workshop, Nov. 7-9, 2001, pp. 64-69.

* cited by examiner

*Primary Examiner*—Thuan Do

(57) ABSTRACT

A computer-implemented method for verification of a hardware design includes specifying requests to allocate regions in a memory of the hardware design, such that at least two of the requests are specified independently of one another. The requests indicate respective allocation types.

Overlap restrictions are specified between at least some of the allocation types. The requests and the overlap restrictions are automatically converted to a constraint satisfaction problem (CSP), which includes CSP constraints based on the requests, the allocation types and the overlap restrictions.

The CSP is solved to produce a random test program, which includes a memory map that allocates the regions in the memory while complying with the requests and the overlap restrictions. The test program is applied to the hardware design.

20 Claims, 3 Drawing Sheets

RANDOM STIMULI GENERATION OF MEMORY MAPS AND MEMORY ALLOCATIONS

FIELD OF THE INVENTION

The present invention relates generally to design verification systems, and particularly to methods and systems for test case generation.

BACKGROUND OF THE INVENTION

The design of hardware devices and systems that involve memory access, such as microprocessor-based systems, is often tested and verified by simulation. Typically, a simulated model of the design is subjected to multiple test cases generated by a test generator. In some cases, memory initialization is performed as part of the test case generation process. Several methods and systems for performing memory allocation in test case generation are known in the art.

For example, U.S. Pat. No. 6,845,440 describes a system for detecting and/or avoiding memory usage conflicts when generating and merging multi-threaded software test cases. Initially, a test case generator is given a unique segment of memory which it can use. A plurality of test cases are generated, one at a time, by the test case generator. When the first test case is generated, the memory segment used is noted. When each of the subsequent test cases is generated, a memory segment of the same size as the first test case, but not overlapping that of the previously-assigned test cases, is assigned to each subsequent test case.

Another memory allocation method is described by Chandra et al., in "AVPGEN—A Test Generator for Architecture Verification," IEEE Transactions on Very Large Scale Integration (VLSI) Systems, (3:2), June, 1995, pages 188-200. In AVPGEN, a memory allocator is invoked for allocating memory under certain constraints for decoded instructions. The memory allocator is invoked sequentially, as instructions are being decoded.

Many tasks that are addressed by decision-making systems and artificial intelligence can be framed as constraint satisfaction problems (CSPs). Generally, when expressing a problem as a CSP, the problem is specified in terms of a set of variables, each of which can assume values in a given domain, and a set of predicates, or constraints, that the variables should simultaneously satisfy. The set of variables and constraints is referred to as a constraint network. Each constraint may be expressed as a relation, defined over some subset of the variables, denoting valid combinations of their values. A solution to the problem is an assignment of a value to each variable from its domain that satisfies all of the constraints.

Several CSP solving methods and tools are known in the art. For example, a number of common solving techniques are described by Kumar in "Algorithms for Constraint Satisfaction Problems: A Survey," Artificial Intelligence Magazine, 13:1 (1992), pages 32-44.

Automatic test generation is sometimes performed using constraint satisfaction methods. The use of CSP in automated generation of test programs is described, for example, by Bin et al. in "Using Constraint Satisfaction Formulation and Solution Techniques for Random Test Program Generation," IBM Systems Journal, (41:3), 2002, pages 386-402. The paper shows methods for modeling random test program generation as a CSP, and describes a set of solution techniques that are used in practical test-case generation tools.

As another example, Adir et al., describe a test generator that uses a dedicated CSP solver in "Piparazzi: A Test Program Generator for Micro-architecture Flow Verification," Eighth IEEE International High-Level Design Validation and Test Workshop (Nov. 12-14, 2003), pages 23-28. The test generator converts user requests for micro-architectural events into test programs.

SUMMARY OF THE INVENTION

There is therefore provided, in accordance with an embodiment of the present invention, a computer-implemented method for verification of a hardware design. The method includes specifying requests to allocate regions in a memory of the hardware design, such that at least two of the requests are specified independently of one another, the requests indicating respective allocation types.

Overlap restrictions are specified between at least some of the allocation types. The requests and the overlap restrictions are automatically converted to a constraint satisfaction problem (CSP), which includes CSP constraints based on the requests, the allocation types and the overlap restrictions.

The CSP is solved to produce a random test program, which includes a memory map that allocates the regions in the memory while complying with the requests and the overlap restrictions. The test program is applied to the hardware design.

The present invention will be more fully understood from the following detailed description of the embodiments thereof, taken together with the drawings in which:

DETAILED DESCRIPTION OF EMBODIMENTS

Overview

Embodiments of the present invention provide methods and systems for generating random memory allocations and memory maps for verifying hardware designs that use memory, such as microprocessor systems and system-on-chip (SoC) designs.

In some embodiments, a model-based random test generator enables a user to model memory allocation-related directives using a declarative language, also referred to as a declarative user interface. Some memory-related directives may comprise validity rules, which are derived from the architecture of the verified design, while others may be specified by the user. By defining the memory-related directives, the user models the different memory resources of the tested design, the memory allocations requested by various hardware components, and the allocation attributes of the requests. The user may also specify memory-related directives that focus the verification process on specific scenarios or events.

As will be shown below, the declarative language enables the user to specify relationships between different memory allocations, even though each allocation request is specified independently of the other requests. This property, which is demonstrated hereinbelow, simplifies the specification process and improves its flexibility and scalability.

Each allocation request is specified as belonging to a certain allocation type, such as program instructions, translation tables and/or direct memory access (DMA) queues. The user defines certain overlap restrictions, which are allowed between some of the allocation types.

The test generator converts the different memory-related directives into constraints, and accumulates the constraints to produce a constraint satisfaction problem (CSP). Each solution of the CSP corresponds to a memory map that satisfies the different constraints. The test generator invokes a CSP solver to solve the CSP. The CSP solver produces multiple solutions of the CSP, and the test generator generates multiple random test cases, in which memory is allocated in accordance with the respective CSP solutions. The test cases usually comprise a corresponding initialization of internal hardware registers. The initialization of both memory and registers is defined by the selected memory map.

Since the generated test cases are derived from value assignments that satisfy the CSP constraints, the test cases are both architecturally-valid and focused on the verification scenario of interest.

Unlike some known verification methods in which memory is allocated manually, the methods and systems described herein enable thorough and error-free verification of a large number of memory allocations. Moreover, the use of a declarative language allows the user to define the test directives in a simple, intuitive, fast and flexible manner, thus reducing the complexity, time and cost of the test definition phase.

System Description

Figure 1:
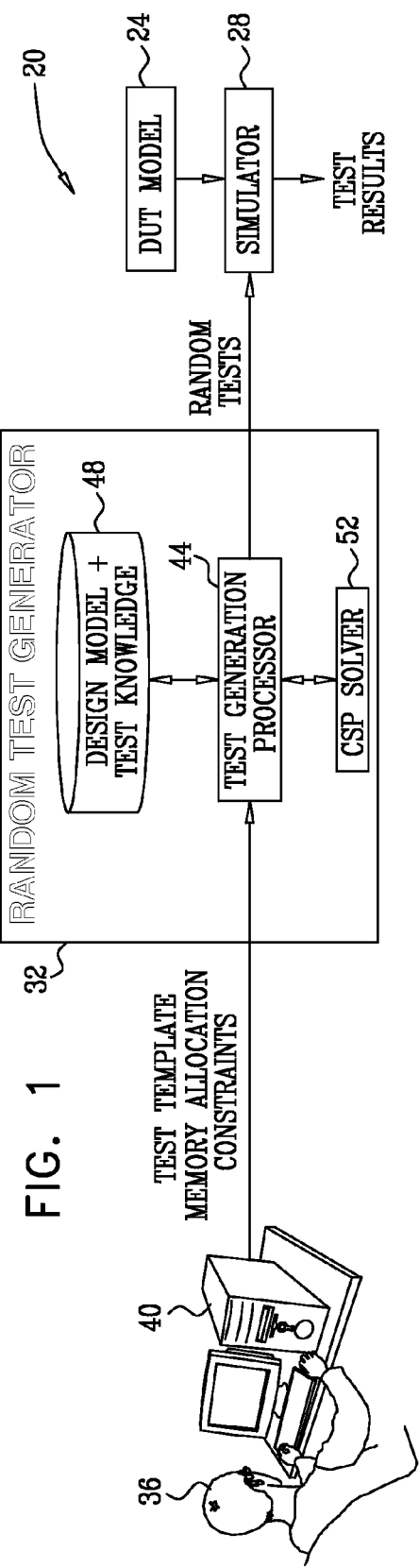
FIG. 1 is a block diagram that schematically illustrates a model-based design verification system, in accordance with an embodiment of the present invention.

FIG. 1 is a block diagram that schematically illustrates a model-based design verification system 20, in accordance with an embodiment of the present invention. System 20 verifies the design of a hardware device or system, such as a microprocessor core, by simulation. The description that follows refers to microprocessor core verification, although the methods and systems described herein can be used for verification of other hardware components and systems that use memory, such as servers or systems-on-chip (SoC).

A simulated model 24 of the microprocessor, also referred to as the Device Under Test (DUT) model, simulates the structure and functionality of the tested microprocessor. The DUT model is provided to a simulator 28, which simulates the operation of the microprocessor under different conditions and stimuli. The simulator outputs pass/fail indications and other relevant information, such as detected non-compliance events and bugs.

In some embodiments, DUT model 24 may be written in a suitable hardware description language (HDL), and simulator 28 may comprise an HDL simulator. Alternatively, any other DUT modeling and simulation methods and tools may be used. For example, the stimuli may be applied to a hardware or firmware implementation of the tested microprocessor design, or to a combination of hardware, firmware and/or software elements.

The simulator subjects the design to different test conditions and stimuli, attempting to detect design faults and other non-compliance events. System 20 comprises a random test generator 32, which produces multiple test cases, also referred to as test programs. The test cases are provided to simulator 28 and are used as stimuli for verifying the design. Typically, the test cases are defined so as to trigger various architectural and micro-architectural events in order to verify the compliance of the design. Each test case typically comprises a resource initialization definition, an instruction sequence that runs on the DUT model, and a set of expected results.

A user 36, such as a design or verification engineer, defines a test template using a user terminal 40. The template defines directives to the test generator, which govern the generation of test cases. The template may define properties such as the number and types of tested instructions, as well as other test directives. In particular, as will be shown in detail below, the test template comprises directives related to memory allocation and initialization of microprocessor registers.

Test generator 32 comprises a test generation processor 44, which generates test cases in accordance with the methods described hereinbelow. Typically, processor 44 comprises a general-purpose computer, which is programmed in software to carry out the functions described herein. The software may be downloaded to the computer in electronic form, over a network, for example, or it may alternatively be supplied to the computer on tangible media, such as CD-ROM.

Test generator 32 comprises a verification database 48, which holds verification-related information, for use by processor 44. Some of the information stored in database 48 relates to the specific design being tested. Additionally, the database may hold generic testing knowledge, which does not relate to a specific test session or design.

The different requirements that specify the random tests to be generated by test generator 32 can be formulated as a set of constraints defined over variables. Generally, the constraints may define architectural restrictions and rules of the verified design, user directives for focusing or otherwise controlling the verification process, and/or restrictions that target specific architectural or micro-architectural behavior that is likely to expose problems. Additionally or alternatively, the constraints may define any other suitable restriction, directive or preference.

Test generation processor 44 accumulates the different constraints and constructs a formula referred to a constraint satisfaction problem (CSP). The CSP typically comprises a conjugation of the different constraints.

Each solution of the CSP, e.g., each value assignment of the variables that satisfies the constraints of the formula, corresponds to a valid test case. The user may also define constraints that focus the tests on specific verification scenarios that are of interest, in which case the solutions of the CSP will focus accordingly. Processor 44 provides the CSP to a CSP solver 52, which solves the formula and returns satisfying value assignments. Using the value assignments, processor 44 generates random test programs that are used as stimuli for simulator 28. CSP solver 52 may use any suitable CSP solving method known in the art, such as the solving methods cited in the Background section above.

System 20 may serve different types of users, either jointly or separately, in the design and verification cycle. One type of user is a modeler, often an application engineer, who creates an architectural model of the verified design. The model is stored in verification database 48, and may comprise architectural validity constructs of the verified design as well as quality constructs. Architectural constructs are typically regarded as mandatory constraints, while quality constructs are sometimes regarded as non-mandatory constraints. Another possible type of user is a verification engineer, who carries out a verification plan of the design by writing test templates that contain user directives. For example, user directives may control non-mandatory quality constructs.

The input to test generator 32 can similarly be classified into user restrictions that relate to the desired verification scenario, typically defined by a verification engineer, and architectural restrictions, typically defined by a modeler. The test generation process accepts both the user restrictions and architectural restrictions and generates test cases that conform to both.

In the description that follows, the term "user" is used to describe any type of user of system 20, such as a modeler, verification engineer, or any other user type. The types of restrictions and directives defined by different user types may overlap or change as desired.

Memory Allocation in Random Test Generation

Typically, each test case generated by test generator 32 comprises three sections: a resource initialization section, an instruction sequence, and a set of expected results. The resource initialization section initializes the memory used by the test case and may also define the initial values of microprocessor registers related to memory allocation. The instruction sequence defines the execution flow of the test case. The expected results define the expected output that should be produced by the simulator when executing the test case, assuming the design is compliant.

For each test case, the simulator initializes the memory and the registers of the DUT model in accordance with the resource initialization section and executes the instruction sequence. Typically, the simulator compares the resulting output with the expected results. If the actual results differ from the expected results, a non-compliance event is reported. Alternatively, any other suitable verification methodology can be used.

Each test case comprises a memory map, which comprises a set of memory allocations used by the test case. The memory map allocates memory areas to be used for different purposes and by different components of the tested design. For example, memory areas can be allocated for storing program instructions, data and translation tables. Different types of translation tables may be used, such as microprocessor code translation tables and DMA engine translation tables. Other exemplary allocation types may comprise memory areas used by interrupt handlers and memory areas used by network adaptors to store incoming data.

The memory may be accessed by different hardware components of the tested design, such as central processing units (CPUs), bridges and DMA engines. Additionally, some elements of the design, such as input/output (I/O) interfaces, may be memory mapped. In some cases, certain memory areas are accessed by two or more components.

Figure 2:
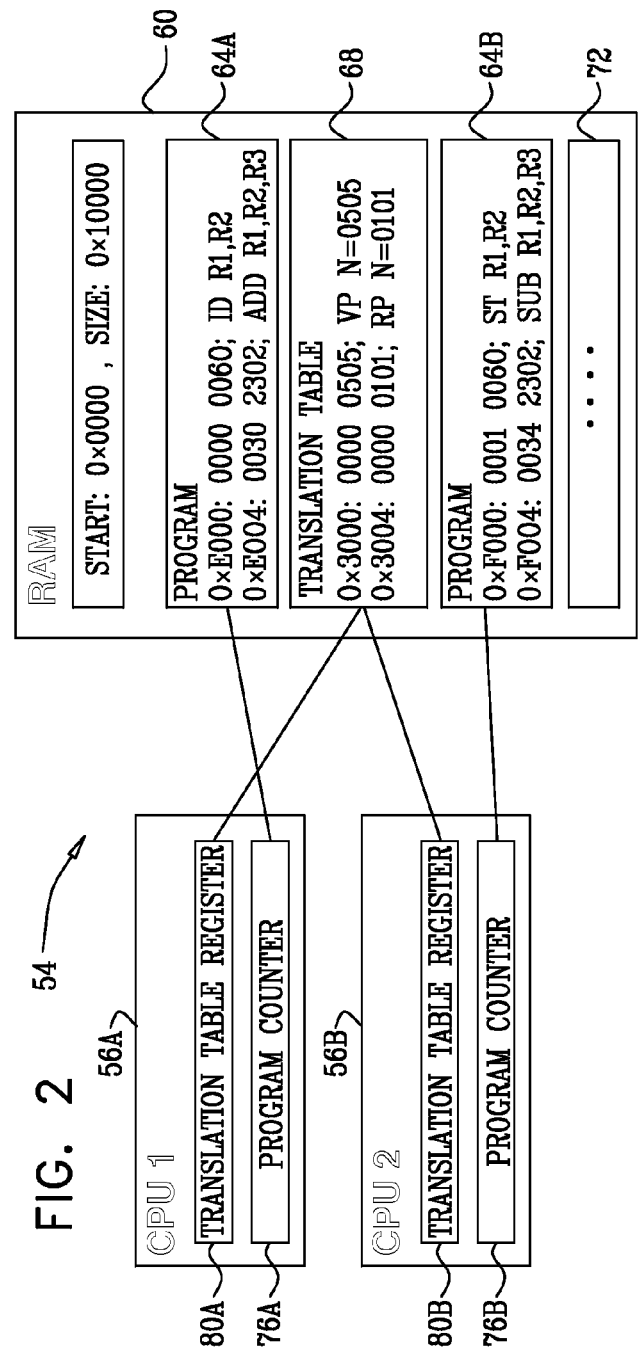
FIG. 2 is a block diagram that schematically illustrates memory allocations in a model of a microprocessor system, in accordance with an embodiment of the present invention.

FIG. 2 is a block diagram that schematically illustrates memory allocations in a model 54 of an exemplary microprocessor system, in accordance with an embodiment of the present invention. Model 54 can be used as part of DUT model 24 of FIG. 1 above. In model 54, the verified system comprises two CPUs 56A and 56B and a random access memory (RAM) 60, which is accessed by both CPUs. Several memory areas are allocated in RAM 60. A memory area 64A is allocated for storing the program code of CPU 56A. Similarly, a memory area 64B is allocated for storing the program code of CPU 56B. A memory area 68 is allocated to hold a translation table that is common to both CPUs. Additional memory areas 72 can be allocated and used for any other suitable purpose, such as DMA queues.

Each of CPUs 56A and 56B comprises registers, whose values correspond to the memory allocations in RAM 60. CPU 56A comprises a program counter 76A, which points to an address in memory area 64A containing the next instruction to be executed. The program counter is typically initialized to point to the address in area 64A holding the first instruction in the instruction sequence of the test case. CPU 56A further comprises a translation table register 80A, which points to the first address of the translation table stored in area 68.

CPU 56B comprises a program counter 76B, which is similar in functionality to program counter 76A. Program counter 76B points to an address in area 64B. CPU 56B further comprises a translation table register 80B, which points to the first address of the translation table stored in area 68. Note that registers 80A and 80B in the present example point to the same memory area.

Model 54 is an exemplary model, chosen for the sake of conceptual clarity. The methods and systems described herein can be used with any other suitable DUT model. For example, the modeled design may comprise a higher number of CPUs or only a single CPU, as well as other hardware components that access the memory. The memory may comprise any number of memory units and memory types, as well as memory-mapped components.

The memory allocations defined in each test case generated by test generator 32 should be legal and valid, e.g., conform to certain architectural rules. For example, the microprocessor may have architectural limitations on the ability to allocate the same memory area for multiple purposes. In some cases, the overlap relationship between certain memory allocation types (e.g., translation tables) may be constrained. As noted above, such architectural restrictions are often defined by a user, such as a modeler, in an architectural model of the verified design.

Figure 3:
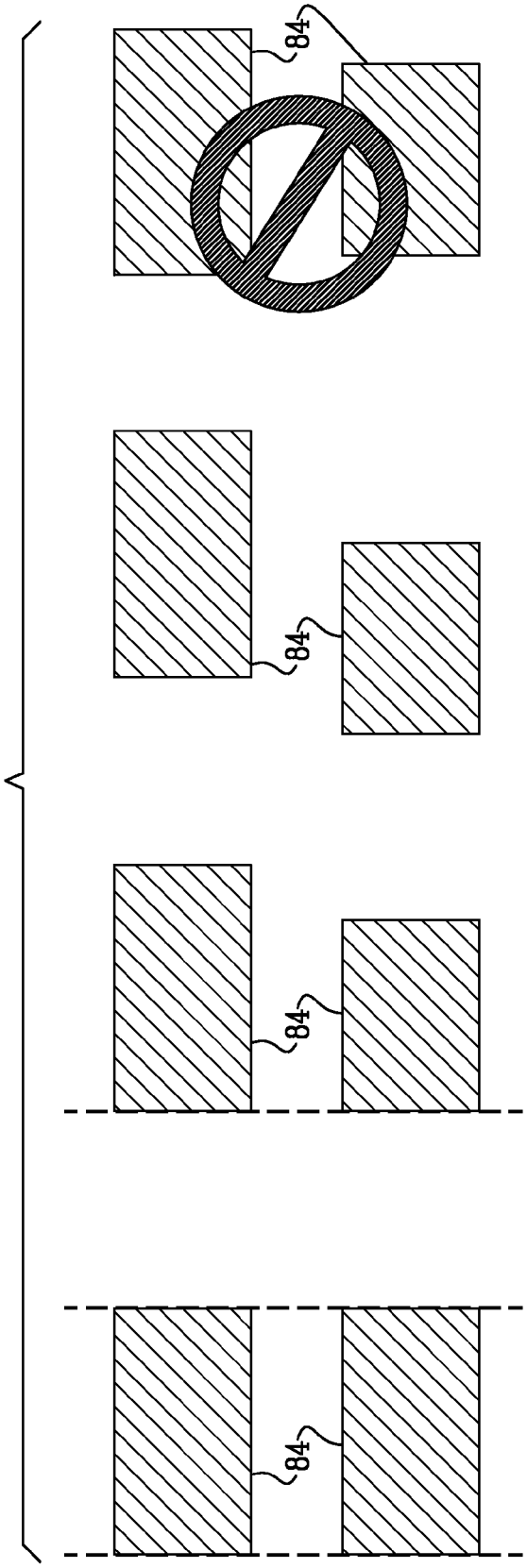
FIG. 3 is a diagram that schematically illustrates exemplary overlap restrictions between memory allocations, in accordance with an embodiment of the present invention.

FIG. 3 is a diagram that schematically illustrates four exemplary overlap restrictions between memory allocations 84, in accordance with an embodiment of the present invention. In some cases, overlap is allowed between two memory allocations only if both allocations are identical, e.g., start and end at the same addresses. This condition is referred to as ALLOW_OVERLAP_IF_EXACT. In other cases, overlap is allowed if both allocations start at the same address. This condition is referred to as ALLOW_OVERLAP_IF_SAME_START. Overlap may sometimes be allowed without restrictions. This condition is referred to as ALLOW_ALL_OVERLAPS. When no overlaps are allowed, the condition is referred to as ALLOW_NO_OVERLAPS.

Additionally or alternatively, the microprocessor architecture may impose alignment requirements or otherwise restrict the starting address of certain memory allocations. Further additionally or alternatively, a user (e.g., a verification engineer) may define additional directives that control the memory allocations. For example, the user may control and focus the tests on specific verification scenarios, such as specific areas of the design and/or specific failure modes and events. The user may also define directives that improve the coverage of the tests, reduce the test generation time, or serve any other purpose. For example, the user may focus some of the tests on scenarios in which all processors share the same translation table, or scenarios in which the translation tables are particularly large or particularly small in size.

In summary, the test template defined by user 36 comprises rules and restrictions, which are related to memory allocation. These rules and restrictions are collectively referred to herein as memory-related directives. Some of the memory-related directives are derived from the microprocessor architecture, while others are related to the desired verification scenario. Typically but not necessarily, most of the memory-related directives originate from the architecture restrictions specified in the model, and the user may later refine, add or bias them.

In some embodiments, the user or users of system 20 define the memory-related directives using a declarative modeling language, also referred to as a declarative user interface. In the present context, a declarative language is defined as an input method, by means of which the user specifies high-level memory allocation requirements and relationships, rather than explicitly defining the low-level constraints and variables themselves. The declarative user interface thus enables the user to explicitly define high-level directives, without having to formulate actual variables and constraints. An implementation example that compares the declarative language with explicit definition of CSP constraints is given further below.

Test generation processor 44 converts the memory-related directives, provided using the declarative language, into a set of constraints, and accumulates the constraints into a CSP. Processor 44 then invokes CSP solver 52 in order to solve the CSP. Processor 44 produces multiple random test cases, whose memory allocations are both valid and focused on the desired verification scenarios.

In some embodiments, the constraints can be classified into mandatory and non-mandatory constraints. For example, constraints related to architectural restrictions and validity rules are normally classified as mandatory constraints. Constraints aimed at focusing the test cases on specific verification scenarios and other "interesting" events can be classified as non-mandatory constraints. The CSP solver may treat mandatory and non-mandatory constraints differently, e.g., produce solutions that satisfy the mandatory constraints but do not necessarily satisfy the non-mandatory constraints. Typically, when there are multiple solutions to the CSP that satisfy the mandatory constraints, the CSP solver gives preference to solutions that also satisfy the non-mandatory constraints, but it may in addition produce some solutions that do not satisfy the non-mandatory constraints.

It should be noted that the description above is focused on memory allocation issues, and aspects of test generation that are not directly related to memory allocation are omitted for clarity. For example, the test template usually contains additional directives and definitions that are related to the execution sequence and to the expected results of the test cases. Similarly, the CSP constructed by processor 44 and solved by solver 52 usually contains additional constraints, such as constraints that are related to the execution sequence of the test cases.

The methods and systems described herein can be implemented as part of any suitable test case generator product. An exemplary model-based random test case generator, which can be used for this purpose, is described by Emek et al., in "X-Gen: A Random Test-Case Generator for Systems and SoCs," IEEE International High Level Design Validation and Test Workshop 2002 (HLDVT'02), Cannes, France, Oct. 27-29, 2002.

Memory Allocation Method Description

Figure 4:
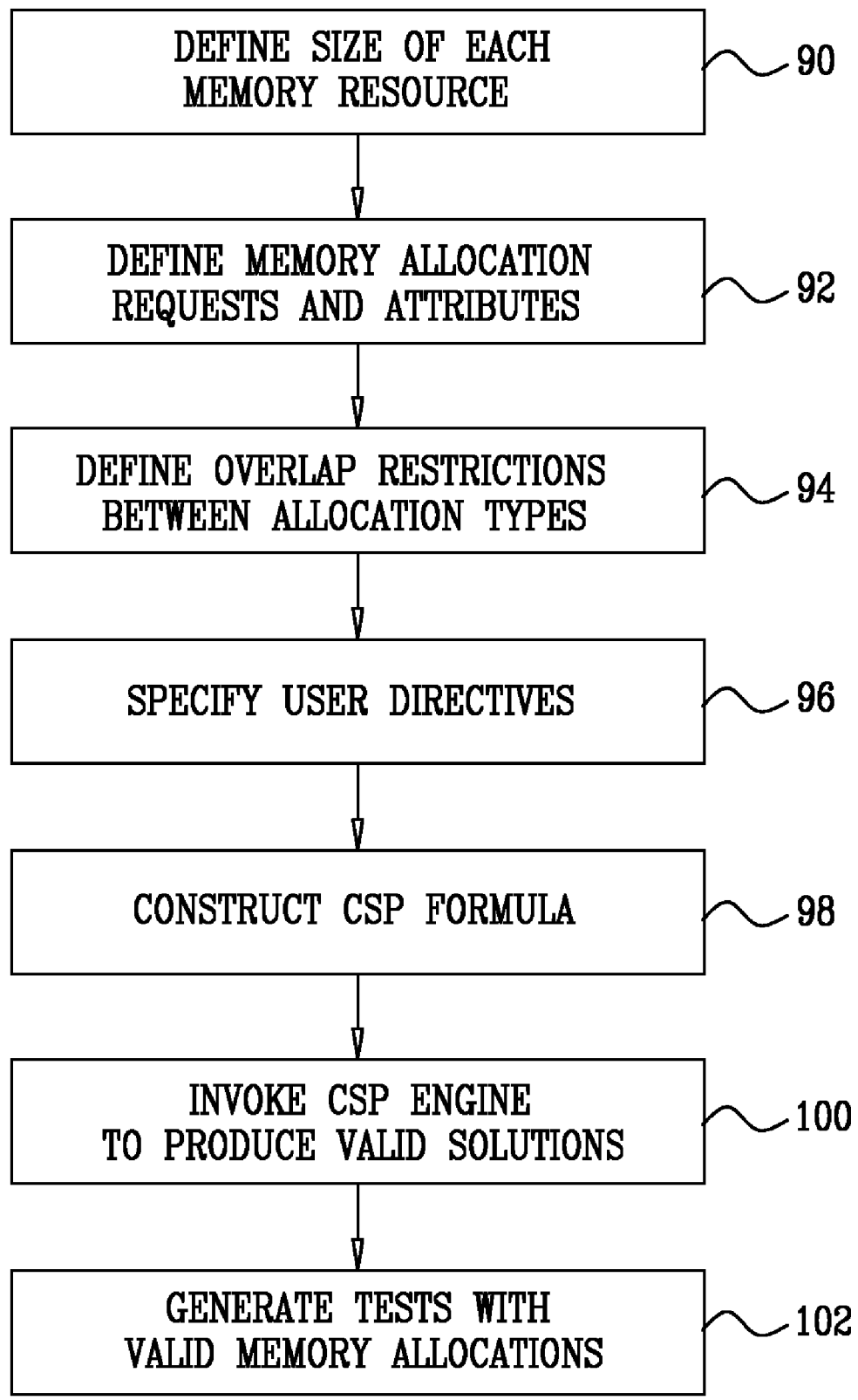
FIG. 4 is a flow chart that schematically illustrates a method for generating memory allocations, in accordance with an embodiment of the present invention.

FIG. 4 is a flow chart that schematically illustrates a method for generating memory allocations, in accordance with an embodiment of the present invention. The method begins with the user defining the size of each memory resource in the tested design, at a size modeling step 90. Resources typically comprise memory units, such as RAM 60 in FIG. 2 above. The tested design may comprise any number of memory units.

The user models a set of allocation requests, at an allocation modeling step 92. Each allocation request comprises a request by one of the hardware components for allocating a memory area for a particular purpose. For example, an allocation request may comprise a request from a CPU to allocate a memory area for storing its program code.

The user defines five attributes for each allocation request, denoted starting_address, length, enable, resource_reference and allocation_type. The starting_address and length attributes define the location and size of the requested memory allocation, respectively.

The resource_reference attribute defines the resource in which the allocation is requested. For example, the verified design may comprise two RAM units and one read only memory (ROM) unit. Each of the three memory units is regarded as a different resource and is identified by a different resource_reference value.

The enable attribute is a Boolean administrative attribute, which indicates whether the allocation is actually active in the present run of the test generator. The allocation_type attribute associates different memory allocations that have a certain overlap relationship, as will be described below.

The values given by the user to the attributes may be explicit, e.g., may comprise specific numerical values. In some embodiments, attribute values may also be selected from a specified range of values, in which case the CSP solver has some freedom in assigning values to the attribute.

For each pair of allocation types, e.g., for each pair of allocations having the same allocation_type attribute value, the user defines the desired overlap restriction, at an overlap modeling step 94. Overlap restrictions may comprise, for example, the ALLOW_OVERLAP_IF_EXACT, ALLOW_OVERLAP_IF_SAME_START, ALLOW_ALL_OVERLAPS and ALLOW_NO_OVERLAPS conditions described in FIG. 3 above. Unless otherwise specified by the user, the default restriction is ALLOW_NO_OVERLAPS.

The user defines additional directives, at a user directive definition step 96. For example, the user may define directives that focus the generated test cases on verification scenarios that are of interest, or for any other purpose. The user may define relationships between the different allocation attributes. For example, an alignment restriction can be specified between the starting_address and length attributes of a particular allocation.

Other definitions may synchronize the allocation attributes and the corresponding microprocessor registers, so that the registers will be initialized to the appropriate values once the memory areas are allocated. For example, a constraint may specify that the program counter register of a particular CPU be initialized with the starting_address of the memory area in which the program code of this CPU is stored.

The user typically models and specifies the different resources, allocation requests, attributes, overlap restrictions and additional constraints in steps 90-96 above using the declarative user interface described above. As noted above, all these definitions, whether derived from the architecture of the verified design or provided by the user, are referred to as memory-related directives.

Test generation processor 44 converts the memory-related directives entered at steps 90-96 above into a CSP, at a CSP construction step 98. Typically, the processor creates CSP variables for the respective attributes of the different allocation requests. Additionally, the processor creates CSP variables that correspond to the initial values of the microprocessor registers.

Processor 44 then automatically adds constraints that ensure an architecturally-legal solution to the CSP. For example, the processor may add constraints that limit the range [starting_address, starting_address+length] of each enabled allocation request to be within the boundaries of the resource defined for the request. As another example, the processor may add constraints that prevent overlap between enabled allocation requests, in accordance with the overlap restrictions defined for these allocations. Processor 44 then adds to the CSP constraints that synchronize between the memory allocations and the initial register values.

The test generation processor invokes CSP solver 52, at a CSP solving step 100. Processor 44 provides the CSP to CSP solver 52. The solver returns a random solution that satisfies the CSP constraints. Per each random solution provided by the CSP solver, processor 44 generates a random test case, at a test generation step 102. In the resource initialization section of each test case, processor 44 specifies the memory map in accordance with the CSP solution, and specifies the initial register values accordingly.

Since the test cases are derived from value assignments that satisfy the constraints, the generated test cases are both valid and focused on the verification scenario of interest.

Implementation Example

The following implementation example demonstrates the advantages of specifying memory allocation requests using a declarative language, as opposed to explicit definition of the CSP constraints. In the present example, the verified hardware design comprises a processor core and a 4 GB memory.

The processor uses the memory to store a page table, which maps virtual addresses to real addresses. The starting address of the page table is specified in a 32-bit register denoted PT_BEGIN. The size of the page table is specified in another 32-bit register denoted PT_SIZE. The page table is enabled only if a bit denoted DR in a register denoted MSR is set.

The processor also uses the memory to store its program instructions. The starting address of the program instructions is stored in a 32-bit program counter (PC) register, and the size of the program is limited to 16 KB. The hardware architecture has a restriction that page tables and instruction areas cannot overlap.

When using explicit definition of CSP constraints, the user would have to define the following set of constraints:

Listing 1: Constraints with One Processor
1. $MSR.DR=1 \rightarrow ((PT\_BEGIN \geq PC+16K)$ or $(PC \geq PT\_BEGIN+PT\_SIZE))$ //Page table and instructions do not overlap.
2. $PC+16\ KB \leq 4\ GB$ //Instructions fit in memory size.
3. $MSR.DR=1 \rightarrow (PT\_BEGIN+PT\_SIZE \leq 4\ GB)$ //Page table fits in memory size.

Now assume that a second processor core is added to the verified design. Assume also that the architecture restricts the sharing of page tables among the processors, unless the tables start and end at the same addresses. In order to specify the memory allocation requests using explicitly-written CSP constraints, the user would have to define the following constraints:

Listing 2: Constraints with Two Processors
1. $(MSR.DR1=1) \rightarrow ((PT\_BEGIN1 \geq PC1+16K)$ or $(PC1 \geq PT\_BEGIN1+PT\_SIZE1))$ //Page table and instructions of first processor do not overlap.
2. $(MSR.DR2=1) \rightarrow ((PT\_BEGIN2 \geq PC2+16K)$ or $(PC2 \geq PT\_BEGIN2+PT\_SIZE2))$ //Page table and instructions of second processor do not overlap.
3. $(MSR.DR1=1) \rightarrow ((PT\_BEGIN1 \rightarrow PC2+16K)$ or $(PC2 \geq PT\_BEGIN1+PT\_SIZE1))$ //Page table of first processor does not overlap instructions of second processor.
4. $(MSR.DR2=1) \rightarrow ((PT\_BEGIN2 \geq PC1+16K)$ or $(PC1 \geq LPT\_BEGIN2+PT\_SIZE2))$ //Page table of second processor do not overlap instructions of first processor.
5. $(MSR.DR1=1\ \&\&\ MSR.DR2=1) \rightarrow ((PT\_BEGIN1 \geq PT\_BEGIN2+PT\_SIZE2)$ or $(PT\_BEGIN2 \geq PT\_BEGIN1+PT\_BEGIN1)$ or $(PT\_BEGIN1=PT\_BEGIN2$ and $PT\_SIZE1=PT\_SIZE2))$ //Page tables of first and second processors do not overlap unless they share the same size and starting address.
6. $(PC1+16\ KB \leq 4\ GB)$ //Instructions of first processor fit in memory size.
7. $MSR.DR1=1 \rightarrow (PT\_BEGIN+PT\_SIZE1 \leq 4\ GB)$ //Page table of first processor fits in memory size.
8. $(PC2+16\ KB \leq 4\ GB)$ //Instructions of second processor fit in memory size.
9. $MSR.DR2=1 \rightarrow (PT\_BEGIN2+PT\_SIZE2 \leq 4\ GB)$ //Page table of second processor fits in memory size.

It can be seen that adding more processor cores and/or allocation requests increases the number of CSP constraints combinatorically. When using a declarative language, on the other hand, the user may specify the following:

Listing 3: Declarative Allocation Statements

Memory: RESOURCE
   size=4 GB

Page_table: ALLOCATION_TYPE

Instruction_area: ALLOCATION_TYPE

ALLOW_OVERLAP (Page_table, Instruction_area) if SAME_START_AND_SAME_SIZE

Allocation1: ALLOCATION
   start=PT_BEGIN1
   size=PT_SIZE1
   type=Page table
   resource=Memory
   enable=MSR_DR1

Allocation2: ALLOCATION
   start=PC1
   size=16 KB
   type=Instruction
   resource=Memory
   enable=true Allocation3: ALLOCATION
   start=PT_BEGIN2
   size=PT_SIZE2
   type=Page table
   resource=Memory
   enable=MSR_DR2

Allocation4: ALLOCATION
   start=PC2
   size=16 KB
   type=Instruction
   resource=Memory
   enable=true Using this method, each allocation request is specified independently of the other requests. As a result, there is no need to define a combinatorial number of constraints that define the relationships among different allocations. Thus, adding the second processor is performed by adding two allocation requests (allocation3 and allocation4). This addition is local, and there is no need to modify any of the other allocation requests.

In some embodiments, automatic translation of the declarative definitions into a CSP can be performed using the following method:
1. For each allocation request, add the constraint allocation.enable→(allocation.start+allocation.size≦resource.size).
2. Add the constraints implied by the "start=", "size=" and "enable=" allocation attributes.
3. For each pair of allocation request add one of the following constraints, depending on the applicable overlap restriction:
   If allocation1.type and allocation2.type cannot overlap, add the constraint (allocation.enable1&&allocation.enable2)→ (allocation1.start>allocation2.start+allocation2.size or allocation2.start>allocation1.start+allocation1.size).
   If allocation1.type and allocation2.type may overlap if they have the same starting address and size, add the constraint (allocation.enable1&&allocation.enable2)→ (allocation1.start>allocation2.start+allocation2.size or allocation2.start>allocation1.start+allocation1.size or (allocation1.start=allocation2.start and allocation1.size=allocation2.size)).
   If allocation1.type and allocation2.type may overlap if they have the same starting address, add the constraint (allocation.enable1&&allocation.enable2)→ (allocation1.start>allocation2.start+allocation2.size or allocation2.start>allocation1.start+allocation1.size or (allocation1.start=allocation2.start)).
   If all overlaps are allowed, do not add any constraints.

Applying the above steps to the declarative statements in Listing 3 above will yield the CSP constraints shown in Listing 2. Alternatively, any other suitable procedure can be used to automatically convert the declarative definitions into CSP constraints.

Although the embodiments described herein mainly address microprocessor verification, the principles of the present invention can also be used for system-level verification of systems that include multiple microprocessors and memory devices, such as systems-on-chip (SoC), and for constructing system-level memory maps for such systems. The methods described herein can also be used in the verification of any other system that includes memory configuration, allocation, initialization and/or partitioning, such as, for example, multi-agent software systems.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A computer-implemented method for verification of a hardware design, comprising:
   specifying requests to allocate regions in a memory of the hardware design, the requests indicating respective allocation types corresponding to different, respective uses of the memory;
   specifying overlap restrictions, which define conditions for permitting overlap among at least some of the allocation types;
   in a computer, automatically converting the requests and the overlap restrictions to a constraint satisfaction problem (CSP), in which the regions requested in the requests are represented by variables and the overlap restrictions are represented by constraints that are defined over the variables;
   solving the CSP to produce a random test program, which comprises a memory map that allocates the regions in the memory while complying with the requests and the overlap restrictions; and
   applying the test program to the hardware design.

2. The method according to claim 1, wherein specifying the requests and the overlap restrictions comprises defining the requests and the overlap restrictions using a declarative language.

3. The method according to claim 1, wherein the allocation types comprise at least one type selected from a group of types consisting of program instructions, translation tables, direct memory access (DMA) queues, memory areas used by interrupt handlers and memory areas used by network adaptors.

4. The method according to claim 1, wherein each request comprises at least one request attribute selected from a group of attributes consisting of a starting address, a length, a resource reference indicating a memory device in which the request is to be allocated, an indication whether the request is enabled and an association of the request with one of the allocation types.

5. The method according to claim 1, wherein the conditions comprise at least one condition type selected from a group of types consisting of a condition allowing overlaps unconditionally, a condition allowing no overlaps, a condition allowing overlap only when the at least some of the allocation types have an identical starting address, and a condition allowing overlap only when the at least some of the allocation types have an identical starting address and an identical size.

6. The method according to claim 1, and comprising specifying a user-defined directive for causing the random test program to focus on an event of interest, automatically converting the user-defined directive to a respective constraint and adding the constraint to the CSP.

7. The method according to claim 1, wherein specifying the requests comprises specifying an architectural restriction of the hardware design, and wherein automatically converting the requests comprises adding an architecture-related constraint to the CSP responsively to the architectural restriction.

8. The method according to claim 1, wherein automatically converting the requests and the overlap restrictions comprises automatically generating the constraints so as to perform at least one function selected from a group of functions consisting of:
   defining a starting address and a size of one of the regions;
   verifying that the one of the regions fits within the memory;
   synchronizing an address of the one of the regions with a respective register initialization value;
   verifying an overlap restriction between two of the allocation types;
   enforcing an additional user-defined directive; and
   enforcing an architectural rule of the hardware design.

9. The method according to claim 1, wherein applying the test program to the hardware design comprises applying the test program to a device-under-test (DUT) comprising at least one element selected from a group of elements consisting of a hardware implementation, a firmware implementation and a software simulation of the hardware design.

10. The method according to claim 1, wherein the memory map comprises a partitioning of an address space of the verified hardware design.

11. Apparatus for verification of a hardware design, comprising:
a CSP solver, which is arranged to solve constraint satisfaction problems (CSP); and
a processor, which is arranged to accept definitions of requests to allocate regions in a memory of the hardware design, the requests indicating respective allocation types corresponding to different, respective uses of the memory, to accept a specification of overlap restrictions, which define conditions for permitting overlap among at least some of the allocation types, to automatically convert the requests and the overlap restrictions to a CSP formula, in which the regions requested in the requests are represented by variables and the overlap restrictions are represented by constraints that are defined over the variables, to invoke the CSP solver to produce a solution of the CSP formula, to produce responsively to the solution a random test program, which comprises a memory map that allocates the regions in the memory while complying with the requests and the overlap restrictions, and to apply the test program to the hardware design.

12. The apparatus according to claim 11, wherein the processor is arranged to accept the requests and the overlap restrictions defined using a declarative language.

13. The apparatus according to claim 11, wherein the allocation types comprise at least one type selected from a group of types consisting of program instructions, translation tables, direct memory access (DMA) queues, memory areas used by interrupt handlers and memory areas used by network adaptors.

14. The apparatus according to claim 11, wherein each request comprises at least one request attribute selected from a group of attributes consisting of a starting address, a length, a resource reference indicating a memory device in which the request is to be allocated, an indication whether the request is enabled and an association of the request with one of the allocation types.

15. The apparatus according to claim 11, wherein the conditions comprise at least one condition type selected from a group of types consisting of a condition allowing overlaps unconditionally, a condition allowing no overlaps, a condition allowing overlap only when the at least some of the allocation types have an identical starting address, and a condition allowing overlap only when the at least some of the allocation types have an identical starting address and an identical size.

16. The apparatus according to claim 11, wherein the processor is arranged to accept a user-defined directive for causing the random test program to focus on an event of interest, to automatically convert the user defined directive to a respective constraint and to add the constraint to the CSP formula.

17. The apparatus according to claim 11, wherein the requests comprise an architectural restriction of the hardware design, and wherein the processor is arranged to add an architecture-related constraint to the CSP formula responsively to the architectural restriction.

18. The apparatus according to claim 11, wherein the processor is arranged to automatically generate the constraints so as to perform at least one function selected from a group of functions consisting of:
defining a starting address and a size of one of the regions;
verifying that the one of the regions fits within the memory;
synchronizing an address of the one of the regions with a respective register initialization value;
verifying an overlap restriction between two of the allocation types;
enforcing an additional user-defined directive; and
enforcing an architectural rule of the hardware design.

19. The apparatus according to claim 11, wherein the processor is arranged to apply the test program to a device-under-test (DUT) comprising at least one element selected from a group of elements consisting of a hardware implementation, a firmware implementation and a software simulation of the hardware design.

20. A computer software product for verification of a hardware design, the product comprising a computer-readable medium, in which program instructions are stored, which instructions, when read by a computer, cause the computer to accept definitions of requests to allocate regions in a memory of the hardware design, the requests indicating respective allocation types corresponding to different, respective uses of the memory, to accept a specification of overlap restrictions, which define conditions for permitting overlap among at least some of the allocation types, to automatically convert the requests and the overlap restrictions to a constrain satisfaction problem (CSP), in which the regions requested in the requests are represented by variables and the overlap restrictions are represented by constraints that are defined over the variables, to solve the CSP formula to produce a random test program, which comprises a memory map that allocates the regions in the memory while complying with the requests and the overlap restrictions, and to apply the test program to the hardware design.

* * * * *